United States Patent
Lee et al.

(10) Patent No.: US 6,249,236 B1
(45) Date of Patent: Jun. 19, 2001

(54) LOW POWER SEISMIC DEVICE INTERFACE AND SYSTEM FOR CAPTURING SEISMIC SIGNALS

(75) Inventors: Wai Laing Lee; Dan Kasha; Axel Thomsen, all of Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/054,544

(22) Filed: Apr. 3, 1998

(51) Int. Cl.$^7$ ............................. H03M 3/00; H03M 1/12
(52) U.S. Cl. ............................. 341/143; 341/172
(58) Field of Search ......................... 341/143, 172, 341/144, 145, 156, 122, 123; 367/36, 65; 375/242; 330/9

(56) References Cited

U.S. PATENT DOCUMENTS

| | | | |
|---|---|---|---|
| 4,066,992 | * | 1/1978 | Buller et al. ........................ 367/36 |
| 5,111,205 | * | 5/1992 | Morlon ............................... 341/156 |
| 5,465,270 | * | 11/1995 | Beauducel et al. ................. 375/242 |
| 5,600,318 | * | 2/1997 | Li ...................................... 341/143 |
| 5,644,257 | | 7/1997 | Kerth et al. . |
| 5,754,131 | * | 5/1998 | Ribner et al. ...................... 341/143 |
| 5,790,062 | * | 8/1998 | Darnell et al. .................... 341/143 |
| 5,805,093 | * | 9/1998 | Heikkila et al. .................. 341/143 |
| 5,818,374 | * | 10/1998 | Tan .................................... 341/143 |
| 5,870,048 | * | 2/1999 | Kuo et al. ......................... 341/143 |

OTHER PUBLICATIONS

Johnston, "New Design Techniques Yield Low Power, High Resolution Delta–Sigma and SAR ADCs for Process Control, Medical, Seismic, and Battery Powered Applications," IEE, 118–123, 1991.*

Burr–Brown Corporation, "Ultra Low Input Bias Current Instrumentation Amplifier", ©1994 Burr–Brown Corporation, pp. 1–9.

* cited by examiner

*Primary Examiner*—Patrick Wamsley
(74) *Attorney, Agent, or Firm*—David L. Stewart; Steven Lin (57) ABSTRACT

A front end for capturing seismic signals uses a voltage doubling circuit and an analog to digital converter (ADC) having different power levels available during respective operational phases. Power available the ADC is controlled so that relatively high power is provided during one phase of operation, such as during an interval when slewing in a device is expected and relatively low power is provided during another phase. Increased power is provided by switching in parallel current mirrors when power demands are expected to be high, whether or not high power is actually needed in a particular interval. A large step size is selected for the ADC to reduce power consumption for a delta sigma modulator used in the ADC and feedback coefficients are optimized for low power by running at a higher oversampling rate than required by signal to quantization noise requirements.

23 Claims, 8 Drawing Sheets

LOW POWER SEISMIC DEVICE INTERFACE AND SYSTEM FOR CAPTURING SEISMIC SIGNALS

CROSS REFERENCE TO RELATED APPLICATIONS

The invention disclosed herein is related to application Ser. No. 09/054,415 filed Apr. 3, 1998, by inventors WaI Laing Lee, Dan Kasha, and Axel Thomsen and entitled "A POWER SAVING AMPLIFIER."

The invention disclosed herein is also related to application Ser. No. 09/054,521 filed, Apr. 3, 1998, by inventors WaI Laing Lee, Dan Kasha, and Axel Thomsen and entitled "A SWITCHED CAPACITOR INTEGRATOR HAVING VERY LOW POWER AND LOW DISTORTION AND NOISE."

The invention disclosed herein is also related to application Ser. No.09/054,542 filed, Apr. 3, 1998, by inventors WaI Laing Lee, Dan Kasha, and Axel Thomsen and entitled "AN ANALOG TO DIGITAL SWITCHED CAPACITOR CONVERTER USING A DELTA SIGMA MODULATOR HAVING VERY LOW POWER DISTORTION AND NOISE."

The disclosures of each of these cases are incorporated by reference herein in their entirety.

BACKGROUND OF THE INVENTION

FIELD OF THE INVENTION

1. Technical Field

The invention relates to seismic exploration and more particularly to an interface to one or more seismic sensors having low power consumption.

2. Description of Related Art

Amplifiers are well known in the art. For high precision switched capacitor circuits and ADC's the class A operational amplifier is well suited. A class A amplifier dissipates a constant amount of power independent on the input or output conditions. This is well suited for low-distortion systems, but poor from a power dissipation point-of-view.

Integrators are also known in the art. Some integrators are passive, in that they are made up of only components such as resistors or capacitors. Other integrators are active, using an amplifier to transfer the signal to an integration element, usually a capacitor. For low distortion, low noise applications, the active integrator is best suited. With CMOS integrated circuits, the switched capacitor integrator, and more generally, the switched capacitor filter is a commonly used circuit. In a switched capacitor circuit, a voltage is sampled on a capacitor in one phase, and the resulting charge is transferred in a second phase. This repeated moving of charge packets results in a current flow. This switched capacitor "branch" behaves much like a resistor when viewed at a low frequency. Its advantage in CMOS integrated circuits include manufacturability and matching to other elements. Delta-sigma modulators are also known which provide a series of binary signals at an output which in a certain frequency range is a digital representation of an input signal.

Systems for conducting seismic exploration are well known in the art. On land, a plurality of transducers are deployed over a region and configured to receive reflections of acoustic signals from different geophysical layers beneath the surface of the earth. Seismic sensors are connected over cables to signal conditioning, digitization and digital recording equipment. When utilizing a seismic system, a strong acoustic signal is generated by, for example, setting off an explosion or by utilizing an acoustic signal generator having a relatively high power output. Reflections of the acoustic signals from the geographical layers are then received at the seismic sensors deployed over a given area and the signals recorded, typically, for later analysis.

One problem with seismic exploration is that it frequently occurs in remote areas. As a result, transportation becomes a problem. Such remote areas typically do not have sources of electrical power. Accordingly, when undertaking seismic exploration in a remote area, electric power must be transported in. Whether the transportation occurs by air or by people physically hiking into a rugged area, weight is a significant factor. A common form of power source utilized in seismic exploration makes use of batteries. Batteries are generally heavy. As a result, any power saving that can be achieved results in significantly reduced costs for a particular exploration.

When seismic exploration is undertaken over water, commonly an array of seismic sensors is towed behind a boat using cables which can extend over a mile in length. Like on land, an acoustic generator is utilized to generate an acoustic impulse, reflections of which occur at geophysical boundaries. Those reflections are detected by the seismic sensors towed behind the boat and recorded, typically, for later analysis. In any seismic environment, it is important to reproduce the captured signals with great precision to insure that the information of interest can be reliably obtained. Like on land, power dissipation is a concern in the marine application. This is because of the problem distributing power over the length of the towed cable.

SUMMARY OF THE INVENTION

A number of techniques are applied to achieve significant power savings when interfacing seismic transducers. Power management between the slew, settling and hold phases of an integrator, maximizing integrator step size, using modulator coefficients optimized for reduced power consumption and use of voltage doubling on the input signal contribute to the power savings.

DETAILED DESCRIPTION OF THE INVENTION

Figure 1:
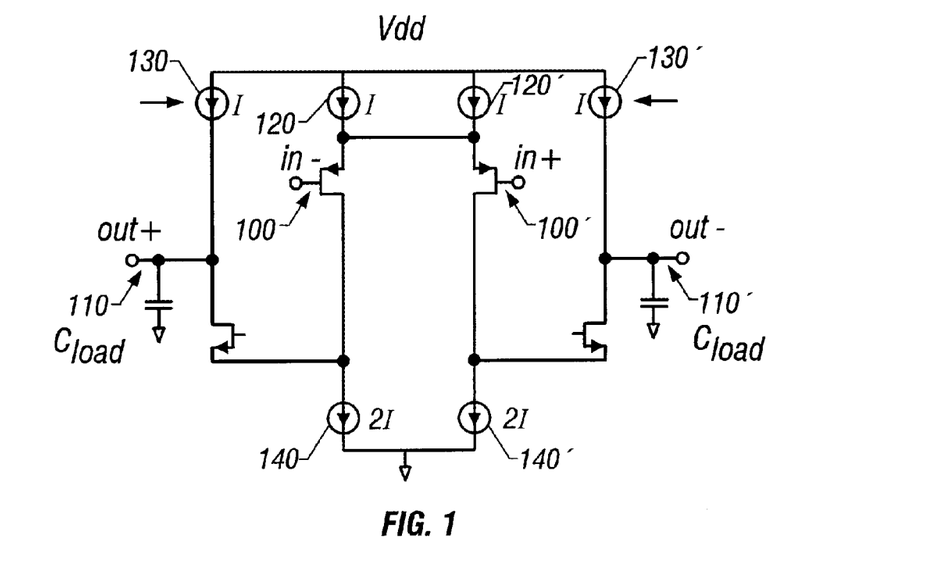
FIG. 1 is a simplified schematic drawing of an amplifier used in accordance with the invention.

FIG. 1 is a simplified schematic diagram of the amplifier used in accordance with the invention. The amplifier shown in FIG. 1 is a simplified folded cascode amplifier, fully differential operating class A. The total power dissipated is 4*I*Vdd. The maximum output current is +/−I. All current sources 130, 120, 140, 130', 120' and 140' are switchable current mirrors having a plurality of current states, including a low current state, a nominal state and a high current state as discussed more hereinafter. In addition, current sources 130 and 130' adjust to maintain common mode level. The construction of current mirrors will be discussed more hereinafter. The input signal to the amplifier of FIG. 1 is applied across terminals 100, 100' and the output signal is taken across terminals 110 and 110'. In operation, during a slewing phase, the switchable current mirrors are switched into a high current mode. In the settling phase, the switched current sources are operated in an intermediate current mode. In the holding phase, current provided by the current sources is reduced even further.

Figure 2:
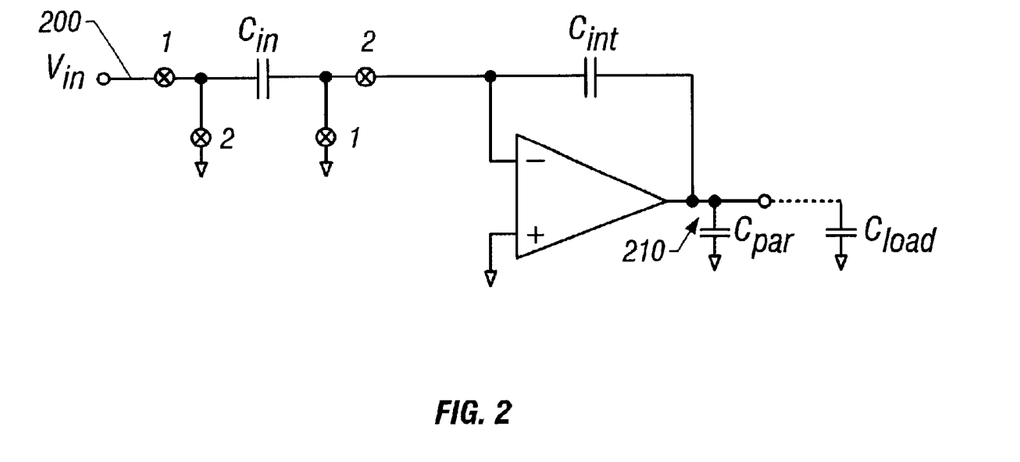
FIG. 2 is a schematic diagram of a switched capacitor integrator using the amplifier of FIG. 1.

FIG. 2 is a single ended representation of a schematic diagram of a switched capacitor integrator using the amplifier of FIG. 1. The input 200 receives an input signal $V_{in}$. Input 200 connects to a switched capacitor circuit. A plurality of switches are arranged around the capacitor $C_{in}$ and are operated so that state 1 switches (those labelled 1) are closed to allow signals through when all state 2 switches (those labelled 2) are open and then, in another state, the state 1 switches are open and the state 2 switches are closed. Considering the capacitor $C_{in}$ during a first time interval, the state 1 switches will be closed permitting capacitor $C_{in}$ to charge to the $V_{in}$ voltage level with reference to a signal ground. In a second state, the state 1 switches are opened and the state 2 switches are closed permitting the voltage charged on the capacitor $C_{in}$ during a first state to be applied to the negative input of the integrator amplifier and the integrator capacitor $C_{int}$. Other arrangements for the switch capacitor are also well known. Among them are reversing the phases described. Using one phase to discharge the capacitor, and the other to charge the capacitor with respect to the amplifier input. A capacitor with one terminal referred to ground, and the other connected to the input in one phase and the amplifier in the other. Also, any of these techniques can be implemented differentially, or with respect to a non grounded reference. These arrangements all result in a similar charge transfer to the amplifier.

This normally causes charge to flow to or from $C_{int}$. When this occurs the op-amp produces an output which restores equilibrium. In an ideal amplifier equilibrium occurs when the negative input of the amp is at the same voltage as the positive input. In the case shown, this is the ground potential.

In this example, most of the work done by the amplifier occurs when the state 2 switches are initially closed. The op-amp shown has three loads, collectively referred to as $C_{LT}$, that must be settled to their final values. They are $C_{par}$, parasitic capacitance at the output terminal; $C_{load}$, any desired loading at the output; and the series connected capacitors, $C_{int}$ in series with $C_{in}$.

The thermal noise in an integrator comes from two major sources, namely (1) the input switch capacitor network(s) and (2) the Op-Amp thermal noise.

Reducing power consumption in a critical amplifier, such as the Op-Amp of an integrator, presents many challenges. Care must be utilized in every aspects in the circuity implemented, whether special or standard, to optimize for minimum power consumption.

There are three major reasons to dissipate power in an amplifier, namely (1) to increase the device $g_m$ for low noise, (2) to increase output current for fast slew, and (3) to increase device $g_m$ for faster settling. For the high performance design required for some applications such as seismic sensing applications, very precise settling is desired. Because of the large total load capacitance $C_{LT}$, the amplifier power requirement is determined by the settling requirements. Power management, as discussed herein, increases the time available for settling. For instance, by increasing the maximum output current during the period where slew is likely to occur, the current in the amplifier during settling can be decreased. This results in a net power savings as discussed more hereinafter.

In FIG. 2, during phase 1 of the integrator operation, that is, when switches 1 are closed and switches 2 are open, capacitor $C_{in}$ is charged to some total charge. During phase 2, that is, when switches 2 are closed and switches 1 are opened, a charge Δq is transferred from $C_{in}$ to $C_{int}$. During this charge transfer, the amplifier must be able to supply an output current I in order to achieve an equilibrium state. If the charge from $C_{in}$ is large enough, the amplifier imbalance will cause it to output the maximum available current, as set by the amplifier bias condition. This condition is known as slew.

Work done in the slew interval is not dependent on the time taken to slew.

$$W = \frac{I \cdot V \cdot t_{slew}}{2} = \frac{g}{t_{slew}} \cdot \frac{V}{2} \cdot t_{slew} = C\frac{V^2}{2} \quad (1)$$

where C is $C_{in}$, and V is $V_{in}$.

Similarly, for a given input, the average power (in period T) required for slew is not dependent on $T_{slew}$.
The power required is:

$$P = \frac{W}{T} = \frac{CV^2}{2T} \quad (2)$$

However, the power required for settling is dependent on the time given to settle. The settling waveform is a negative exponential in which the remaining error voltage, that is the difference between the amplifier actual output voltage and its ideal settled voltage, as a function of time, is stated as:

$$V_e(t) = V_i e^{-t(g_m/C_{LT})} \quad (3)$$

where $V_i$ is proportional to the charge transferred.

Thus, the error voltage can be reduced by either increasing the settling time t or by increasing $g_m$ of the amplifier device. $g_m$ of a MOSFET device, in strong inversion is proportional to the square root of the current flowing through it. $g_m$ of a MOSFET in weak inversion, and of a bipolar device is proportional to the current (I) in the device. To meet the design targets in accordance with the invention, to have a small enough error voltage, $V_e$, one requires a time of >10 $\tau$ to settle, where $\tau$ is calculated as follows for a MOSFET in strong inversion:

$$\tau = C_{total\,load} / g_m = C_{LT} / \sqrt{2K\left(\frac{w}{l}\right)I} \quad (4)$$

Referring to FIG. 2, for a MOSFET amplifier, the equation governing settling, restated is:

$$V_e(t) = V_i e^{-t \cdot \sqrt{2K\frac{W}{L}I} / C_{LT}} \quad (5)$$

Applying this concept in accordance with the invention, we can increase the current in the portion of the cycle where we expect slew. This has no net power penalty. The slew is completed in a time proportional to the current. By completing the slew faster, we allow more time for settling, and can run the amplifier at a reduced $g_m$. Since accurate settling is often the deciding factor in amplifier power, there is a significant net power savings.

An additional savings is achieved by a further reduction of power of the amplifier after the slew/settling phase is complete. After the slew and settling phases are complete, the amplifier no longer integrates incoming signal charge on the integration capacitor. The negative input of the amplifier has been returned to the equilibrium value, which differs from some reference value by only non-idealities. In this hold phase, the amplifier non-idealities do not have a significant effect, and the performance of the amplifier can be modified to save power.

The reason that noise and offset caused by the amplifier in the hold phase are less relevant in some applications can be seen by looking at the amplifier output voltage. In an ideal case, the terminal of $C_{int}$ connected to the amplifier is at the same voltage as the non-inverting terminal. For this example, one assumes 0 volts, or ground. The integration capacitor has a voltage across it that is the integral of the input(s), and the output voltage is this integral.

If the amplifier has non-idealities, such as noise, the input connected to $C_{int}$ is not at ground, but at some noise voltage $V_n$. This means the output differs from the proper value by this voltage $V_n$. Clearly, the noise adds to the output value, and at low frequencies, where the signal band is located, an integrator often has a very large amount of gain. It would take a very small input signal, to correct for the error $V_n$ which means it is not a significant noise contribution. For this reason, where the amplifier does not have to transfer charge or settle the input(s), we can reduce the power in the amplifier. By contrast, when signal is being settled, any noise $V_n$ results in a final noise charge not being delivered from the input(s). In this phase, the input referred noise is $V_n$.

When reducing power during a hold phase, adequate power must remain to settle any activity that can occur in the phase. In the case of a Δ-Σ modulator, such as one described hereinafter, the second integrator switched capacitor input samples a first integrator's output. However, this sampling cap is much smaller than integrator 1's input capacitors, and the disturbance is negligible. In this phase, a 4:1 reduction creates no problems.

There is another savings in power in the hold phase. The large integrator input capacitors are not connected to the amplifier in this phase. The amp does not have to settle this capacitance, meaning less power is required to settle any disturbances in this phase. This assumes that any loads switched to the output of integrator 1 are small compared to integrator 1's input capacitors.

Figure 3:
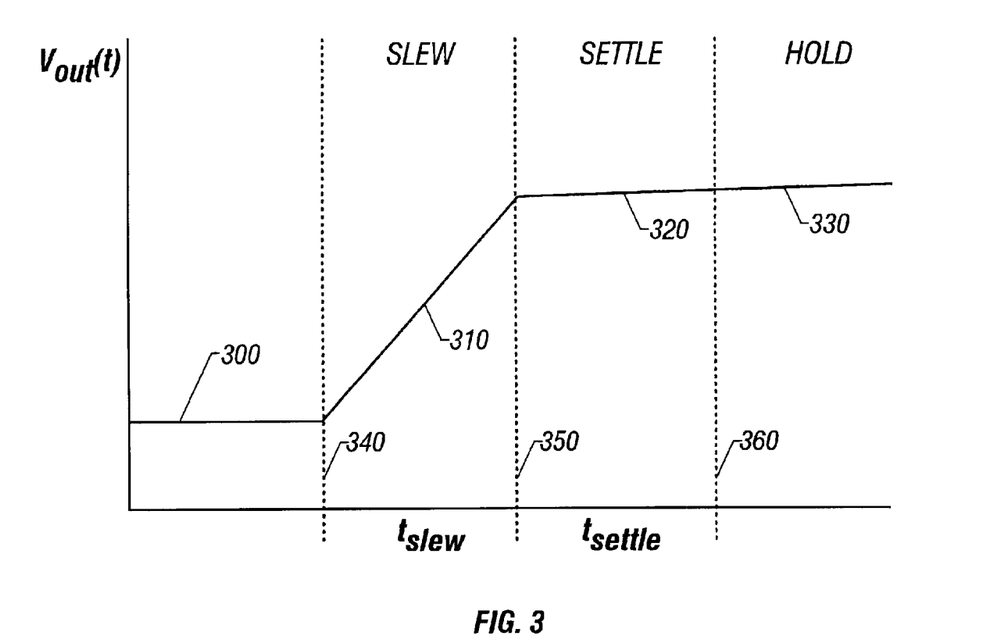
FIG. 3 is a graph showing typical amplifier response to a step change in input.

FIG. 3 is a graph showing typical amplifier response to a step change. When a signal on the input of the amplifier output changes from a first level V1 to a second level V2, the output to the amplifier changes in a manner represented in the graph of FIG. 3. With the input of the amplifier at V1, the output of the amplifier will substantially be that shown at the portion of the curve 300. When the input signal changes substantially simultaneously from V1 to a different value V2, the output of the amplifier will begin to change to restore equilibrium. Equilibrium is eventually restored as shown at portion of the curve 330. In between portions of the output curve 300 and 330 there are essentially two areas of interest, namely a slewing portion 310 and a settling portion 320. During the slewing portion of the curve 310, the input conditions on the amplifier cause the amplifier to provide (or sink) its maximum current. This current transfers charge to the integration capacitor, eventually restoring the inputs to the equilibrium condition, and reducing the output current. The amplifier will output (or sink) the maximum current until the inputs are very near each other in voltage, and linear settling takes place. In slew, output current is maximum, either sourced or sinked.

The class A amplifier, without power management, consumes the same power whether slewing, settling or holding its value. In accordance with the invention, this power changes according to the operational phase (expected activity); not according to the signal.

In accordance with the invention, in a preferred form, current provided to the amplifier during a slew phase is N times that provided during a settling phase, where N=4 in the examples discussed herein. The current provided to the amplifier during a hold phase is reduced to one quarter of that provided during the settling phase. How this is done is discussed more hereinafter.

Figure 4:
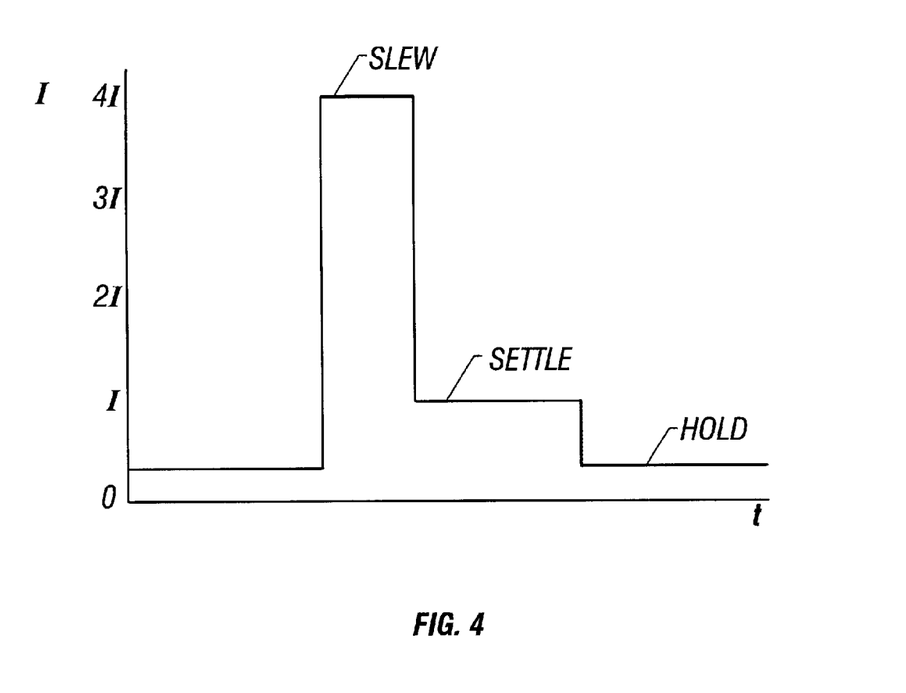
FIG. 4 is a graph of current levels available during exemplary phases of amplifier operation.

FIG. 4 is a graph of current levels available during exemplary phases of amplifier operation. In a clocked system, certain changes occur, if at all, during pre-defined portions of the clock cycle. In accordance with the invention, the current available to the amplifier changes based on the expected activity that could occur during an operational phase. For example, in FIG. 4, during a slew interval, the current provided to the amplifier is, in this case, four times that provided during the settling phase. That current is available to the amplifier, whether or not a signal actually exists on the input which would cause the amplifier to slew. Similarly, the current available during the settle interval is available, whether or not a transition has occurred during the slew interval which would require settling. Thus the current and therefore the power available to an amplifier varies as a function of expected activity whether or not actual activity occurs during that interval. During a hold phase, very little current is required and so the current provided to the amplifier during a hold phase is reduced yet further. In the examples shown in FIG. 4, a current I is provided during the settle phase, a current 4I is provided during the slew phase and a current I÷4 is provided during the hold phase. These ratios can be adjusted depending on a particular application.

Figure 5:
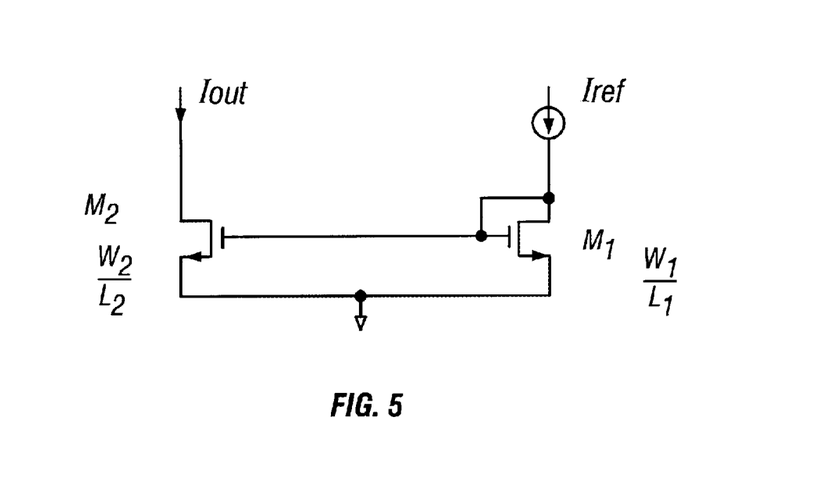
FIG. 5 is a schematic diagram of a simple current mirror.

FIG. 5 is a schematic diagram of a simple current mirror. The current sources shown in FIG. 1 are current mirrors such as shown in FIG. 5. As shown in FIG. 5, one can increase the output current by increasing the reference current $I_{ref}$. However, this causes head-room problems. Head room refers to the minimum voltage across a current source required for proper functioning. One could increase the width of the output device $M_2$ ($W_2$) by switching in a parallel output device, but this would cause settling problems and timing problems with other mirrors. One can also decrease the output current by decreasing $I_{ref}$, or switching out parallel devices.

Figure 6:
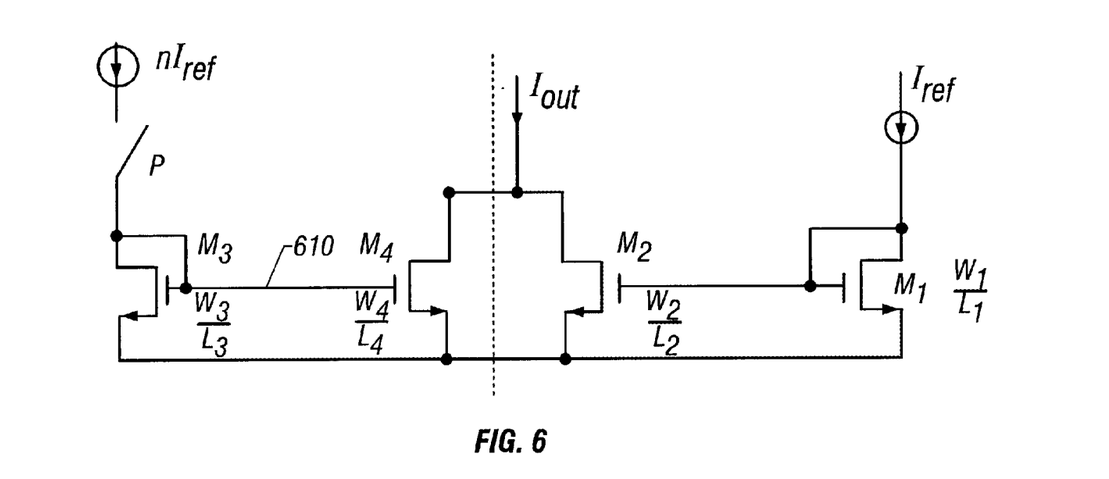
FIG. 6 is a schematic diagram of a parallel current mirror used during a high power phase of an amplifier's cycle.

FIG. 6 is a schematic diagram of parallel current mirrors used during a high power phase of an amplifiers operational cycle. Rather than disturbing the low power mirror, one can simply turn on another mirror in parallel during a high power phase. This results in the least disturbance to the amplifier in the lower power phases, since the high power mirror is off, and the lower power mirror can be optimized for the critical settling phase, specifically to contribute minimum noise and to settle any glitches quickly.

FIG. 6 shows a current mirror comprising devices $M_1$ and $M_2$ together with a second current mirror comprising devices $M_3$ and $M_4$. Note that although the low current mirror shown on the right provides a contribution to $I_{out}$ based on $I_{ref}$, the high powered mirror on the left provides a contribution to $I_{out}$ based on $n.I_{ref}$. The switch P shown in FIG. 6 indicates that the high power current mirror selectively is switched on or off. When high power is expected to be required in amplifiers, such as during an expected slewing phase, the switch P is closed and both current mirrors provide current to the amplifier in a high power mode. When high power is not required, such as during the settling phase, and/or during the holding phase, the switch P will be opened and amplifier is supplied by only the right current mirror $M_1$ and $M_2$.

The implementation shown in FIG. 6 has many problems. Problems occur mostly at turn on/off. First, if the current in $M_3$ is turned fully off, the gate voltage is not controlled, and some undefined current can flow in $M_4$. A small current could remain in $M_3$, but then the $g_m$ will be very weak for the amount of gate capacitance, and control of the gate node will be very slow. Also, with a small amount of current in $M_3$, $M_4$ will contribute to the bias currents in the amplifier. This means that the high power circuits would have to be designed to not adversely affect the amplifier, especially with noise. Secondly, the gate node could be controlled with a pull down resistor or transistor. This causes its own problems. First timing of switches is more difficult depending on the arrangement. Secondly, un-acceptable delay, since upon turn-on, the node would have to be changed over a significant voltage range from the pulled-down state. It is preferred to utilize the control circuit shown in FIG. 7 for activating a parallel current mirror in high power mode.

Figure 7:
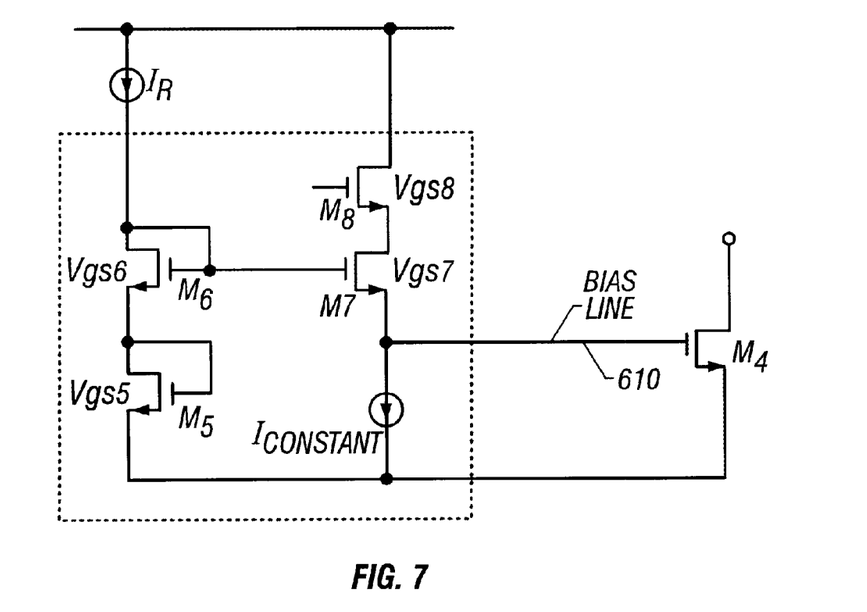
FIG. 7 is a schematic diagram of a preferred control circuit for use with a current mirror in accordance with one aspect of the invention.

In FIG. 7, device $M_4$ corresponds generally to device $M_4$ of FIG. 6. The bias line 610 shown in FIG. 7 corresponds to bias line 610 of FIG. 6. Current source $I_R$ of FIG. 7, corresponds generally to current source $nI_{ref}$ of FIG. 6. The bias line control circuit shown in the dashed box of FIG. 7 controls the bias line 610 without the adverse effects previously described. Control of current in $M_4$ of FIG. 7 is accomplished by a small change in current $I_R$. This method used to charge $I_R$ will be presented following explanation of the control circuit.

Consider the circuit of FIG. 7. $I_R$ takes on two values. When $M_4$ should act as a current source, $I_R=I_{constant}$, also referred to as $I_C$. When $M_4$ should be off, $I_R$ is reduced. These two states are referred to as $I_R$ high state and $I_R$ low state, respectively. Device $M_7$ provides a consistent high $g_m$ controlling the bias line to output device $M_4$. The voltage $V_{gs6}$ is equal to $V_{gs7}$ when current $I_R$ is in a high state. However, $V_{gs6}<V_{gs7}$ when $I_R$ is low. This guarantees shutdown. $V_{gs5}$ defines $V_{gs4}$ when $I_R$ is high. $V_{gs5}$ does not have to match $V_{gs6}$ or $V_{gs7}$, however to simplify discussion, devices $M_5$, $M_6$, $M_7$ are assumed to match.

To explain why a small change in $I_R$ makes a complete shutdown:

Assume $M_5=M_6=M_7$. $I_R$ has a high state, where $I_R=I_c$, and a low state, $I_R=I_c/4$.

Consider a loop $$V_{out}=V_{gs5}+V_{gs6}-V_{gs7}$$

When $I_R=I_c$, all $V_{gs}$'s match, and $V_{out}=V_{gs1}=V_T+\Delta V_H$.

The gate of $M_4$ has this voltage, and will conduct well because it is turned on by an amount $\Delta V_H$ in excess of threshold voltage, $V_T$.

$\Delta V$ is:

$$\Delta V = \sqrt{\frac{2}{K'}\frac{L}{W}I_D}$$

In the low state, with $$I_R = \frac{1}{4}I_C$$

$$V_{out}=2V_T+2\Delta V_L-(V_T+\Delta V_H)$$

$$V_{out}=V_T+2\Delta V_L-\Delta V_H$$

$$V_{out} = V_T + 2\sqrt{\frac{2}{K'}\frac{L}{W}\frac{I_C}{4}} - \sqrt{\frac{2}{K'}\frac{L}{W}I_C}$$

$$V_{out} = V_T + \sqrt{\frac{2}{K'}\frac{L}{W}I_C} - \sqrt{\frac{2}{K'}\frac{L}{W}I_C}$$

$$V_{out}=V_T$$

Now, $M_4$ does not conduct because there is no $\Delta V$ above $V_T$. With a greater than 4:1 ratio, $V_{out}$ would drop below $V_T$, assuring shutdown. In a preferred implementation, a ratio of 10:1 is used.

Current $I_C$ and $I_R$ as well as the devices discussed could be scaled without affecting the performance.

Thus a simple very effective technique for controlling a current source may be achieved by steering currents away from $M_5$. (A ratio of approximately 10 to 1 in current reaching $M_5$ is more than enough to get 1000:1 ratio in output current between the on and off states.)

When comparing a similar amplifier without the power management just described with an amplifier which has slew and settling power management, one can see some striking improvements.

|  | With | Without (conventional) |
| --- | --- | --- |
| % of time in Slew | 30 | 53 |
| Tail current while slewing | 2500 uA | 1450 uA |
| Tail current while settling | 660 uA | 1450 uA |
| Current ratio | 3.8:1 | 1:1 |
| Power | 11.7 mW | 18.2 mW |

The 11.7 mW consumed by a device using power management described herein, represents a 35% savings in power over the 18.2 mW which would be consumed without power management in a similar configuration.

Figure 8:
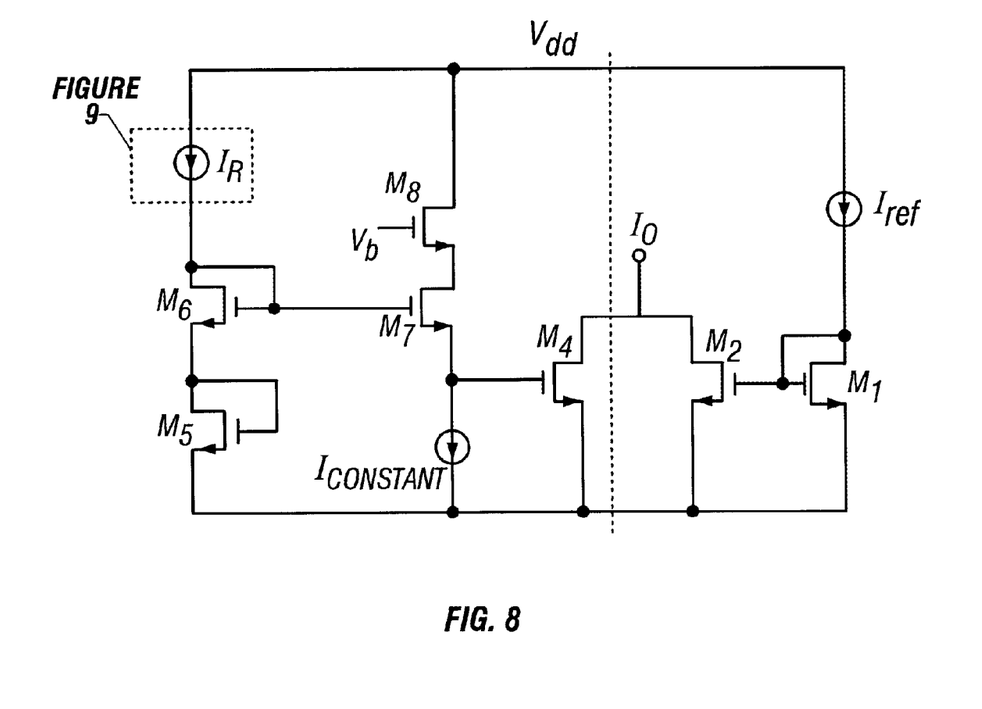
FIG. 8 is a schematic diagram of the control circuit of FIG. 7 controlling a current mirror, such as the high power current mirror of FIG. 6, along with a low power mirror.

FIG. 8 is a schematic diagram of the control circuit of FIG. 7 used as a high power current mirror, in parallel with a constant current mirror. The circuitry to the right of the dashed line in FIG. 8 corresponds to the same in FIG. 6. The circuitry to the left of the dashed line in FIG. 8 replaces the switched mirror to the left of the dashed line in FIG. 6. As discussed above, a change in current $I_R$ (in FIG. 8) results in turning on or off the current contribution from device $M_4$ to the output current. Control of the switching current $I_R$ is described more in conjunction with FIG. 9.

Figure 9:
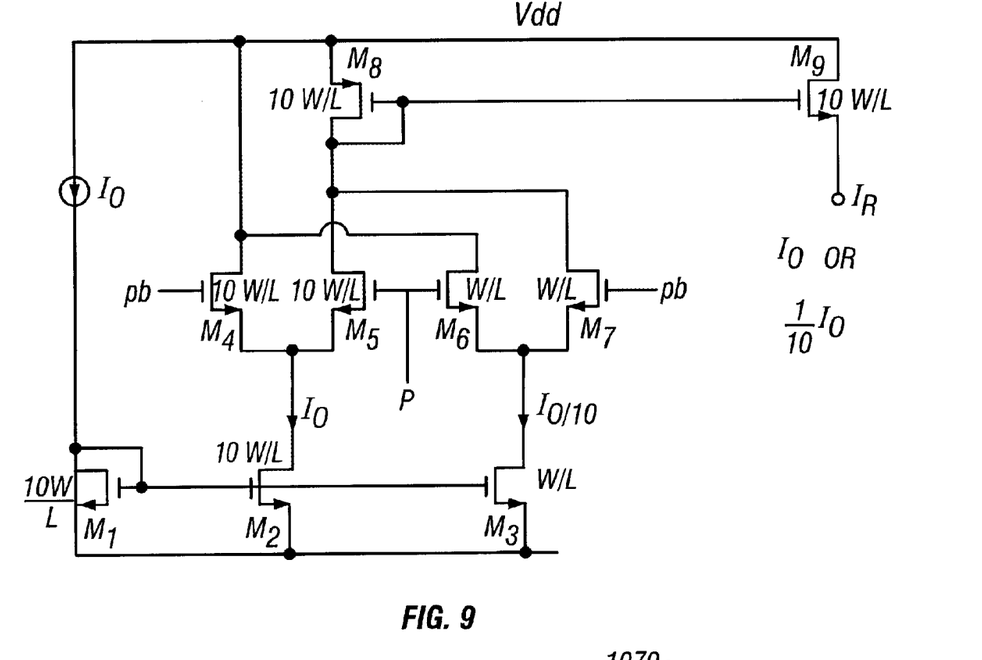
FIG. 9 is a schematic diagram of a portion of control circuit of FIG. 8 showing exemplary current steering.

FIG. 9 is a schematic diagram of a portion of control circuit of FIG. 8 showing exemplary current steering. This is a circuit that implements $I_R$ of FIG. 8. As shown, the output current varies 10:1. $I_o$ is a constant reference circuit. $M_1$ and $M_2$ match, while $M_3$ is one tenth the width/length. The current in $M_2$ is $I_o$, and in $M_3$ is $I_o/10$. P is a control signal that will steer either $I_o$, or $I_o/10$ into device $M_8$, which is mirrored in device $M_9$, as the output current. All device sizes and current levels are for illustration and could be changed as needed. pb is the complement of p.

When p is high, pb is low, $M_5$ and $M_6$ are conducting. $M_4$ and $M_7$, are not conducting. $M_2$'s $I_o$ will flow through $M_5$ and $M_8$. $I_o/10$ from $M_3$ will be sourced from the supply. $I_o$ will be mirrored by $M_9$. When pb is high, $M_2$'s current $I_o$ is sourced from the supply. $M_2$'s current $I_o/10$ is sourced through $M_7$ and $M_8$, resulting in $I_o/10$ being mirrored out with $M_9$.

In the hold phase, reduction of the current can be performed over a limited range by simply adjusting $I_R$ in FIG. 6. This is because headroom is not a problem when reducing current levels. The current steering circuit of FIG. 9 is used to implement the current reduction in the hold phase. For the hold phase, the transistors are sized to give current $I_o$ and $I_o/4$, and transistor $M_9$ of FIG. 6 replaces source $I_{ref}$ of FIG. 6. A control circuit similar to that of FIG. 7 could have been used for the hold phase current reduction, but was not needed.

The circuit is slightly simplified in that cascade devices not relevant are not shown.

Another power savings comes from maximizing the output step size in the switched capacitor integrator, by reducing $C_{int}$. Though this places added difficulty on the amplifier design, the power savings is significant. The reduction in $C_{int}$ results in a proportional reduction of parasitics associated with $C_{int}$. The parasitic of $C_{int}$ is often a significant component of total load capacitance $C_{LT}$.

Looking at equation (4), for a given time constant τ, if $C_{LT}$ is reduced by a factor of two, the current through a MOSFET in strong inversion could be reduced by a factor of 4. The term $V_i$ is proportional to the charge to be transferred. The increased step size may increase the voltage $V_i$. However, since the ideal settle voltage has been increased, larger error $V_e(t)$ is acceptable. As mentioned earlier, such a switched capacitor integrator is often used in a Δ-Σ modulator. Each integrator in FIG. 10 can be a switched capacitor integrator as described, with the step size maximized. Similar savings would result for stages whose $g_m$ is governed by other equations, such as the MOSFET in weak inversion, or the bipolar device.

Figure 16:
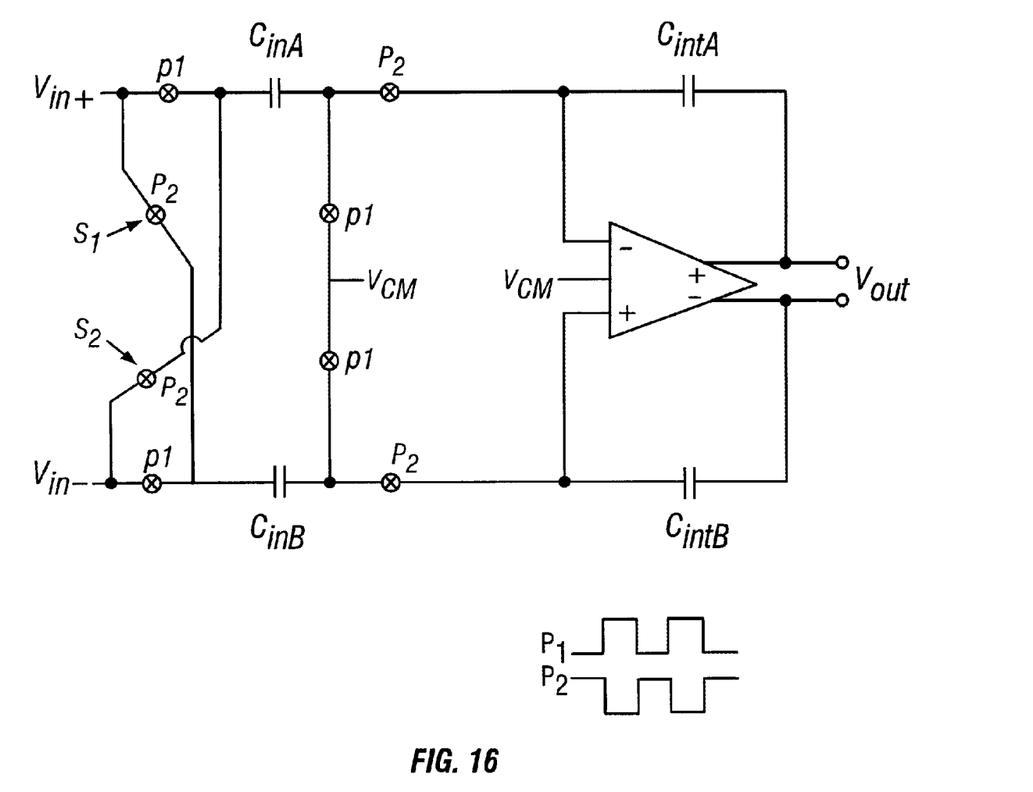
FIG. 16 is a schematic diagram of a switched capacitor differential front end circuit providing additional power savings.

FIG. 16 is a schematic diagram of a switched capacitor differential front end circuit providing additional power savings. A cross coupled input structure is used to boost the signal charge integrated in each cycle. In phase p1, $C_{inA}$ is charged to voltage $V_{in+}-V_{CM}$. In phase p2, $C_{inA}$ is connected between the amplifier (inputs at approximately $V_{CM}$) and $V_{in-}$. The final voltage on the cap at the end of phase p2 is $V_{in-}-V_{CM}$. The total charge transferred to $C_{intA}$ is:

$$Q=CV$$

$$Q_{p1}=C_{inA}(V_{in+}-V_{cm})$$

$$Q_{p2}=C_{inA}(V_{in+}-V_{cm})$$

$$Q_{totalA}=Q_{p1}-Q_{p2}=C_{inA}(V_{in+}-V_{in-}+V_{cm})$$

$$Q_{totalA}=C_{inA}(V_{in+}-V_{in-})$$

If $V_{in}$ is balanced around $V_{cm}$, then $V_{in+}=-V_{in-}$, so $$Q_{totalA}=C_{inA} \cdot 2V_{in+}$$

Likewise, $C_{inB}$ delivers $$Q_{totalB}=C_{inB} \cdot 2V_{in-}$$

By using a cross coupled input, through switched S1 and S2, we double the delivered charge. In a non-cross coupled circuit, these switches would connect the capacitors to $V_{CM}$. The power savings arises because in a non-cross coupled circuit, $C_{inA}$ and $C_{inB}$ would have to be larger to deliver the same charged. $C_{inA}$ and $C_{inB}$ increase the loading on the amplifier, and would require more power to settle.

Figure 10:
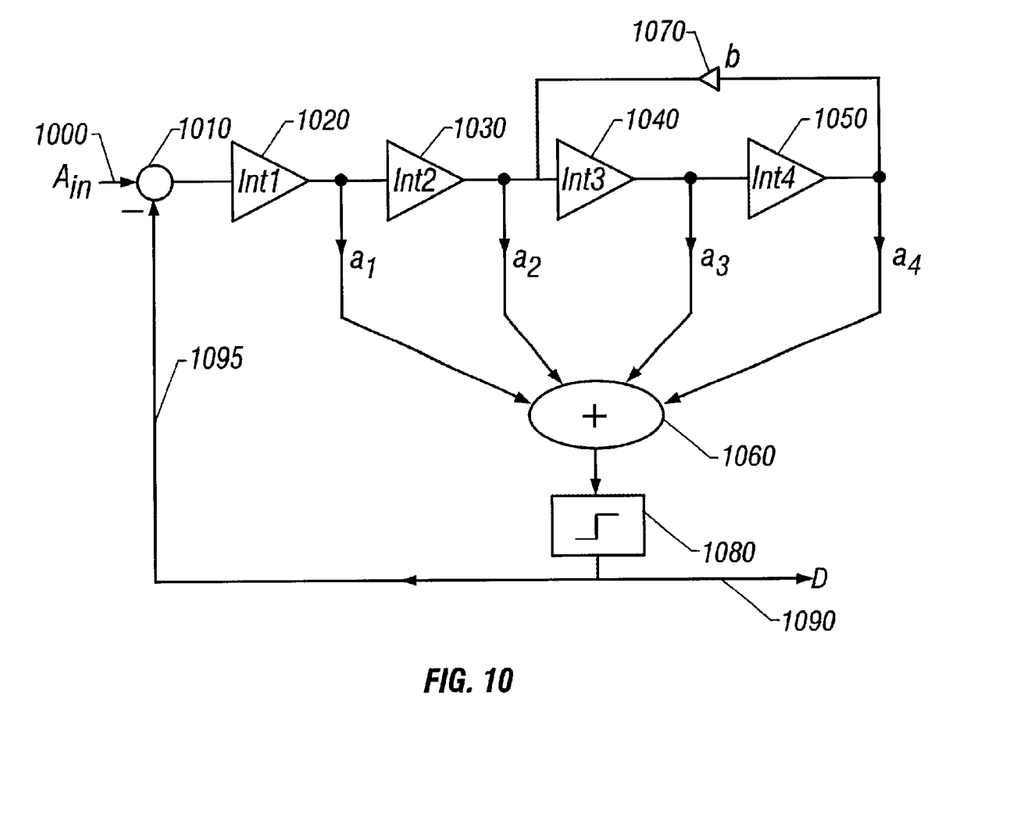
FIG. 10 is a block diagram of an analog to one-bit digital converter in accordance with the invention using a delta-sigma modulator.

FIG. 10 is a block diagram of a Δ-Σ modulator used to digitize the incoming signal. The incoming signal is applied at input 1000 ($A_{in}$) and the analog incoming signal is applied to one input of subtraction circuit 1010. Subtraction 1010 receives as the other input, the output of comparator 1080. The output of subtraction of circuit 1010 is integrated with a series of cascaded integration circuits 1020, 1030, 1040 and 1050. The output of each integrator is applied, using a respective weighing coefficients, a1, a2, a3 and a4 to a summing circuit 1060 where the values of the signals are summed. The Δ-Σ modulator operates at a sampling rate $f_s$, and in each cycle, the summed value is compared to some threshold value. If the output of summing circuit 1060 is greater than a threshold value, a digital pulse is applied to output 1090 as well as to a subtraction input of subtraction circuit 1010. If the output of the summing circuit 1060 is less than the threshold, then no digital output will be produced. These comparisons occur at a sampling rate as discussed more hereinafter. At low frequencies, the noise at output 1090 is dominated by thermal noise, usually generated in the front end, 1000, 1010, 1020 and 1095. At higher frequencies, the noise is dominated by the quantization introduced by the comparator 1080. The output D is a digital representation of $A_{in}$. D is a 1-bit stream at a rate $f_s$, and contains two levels. In other "multi-bit" modulators, D is a multi-bit signal at rate $f_s$, representing a multi level comparison.

Figure 13:
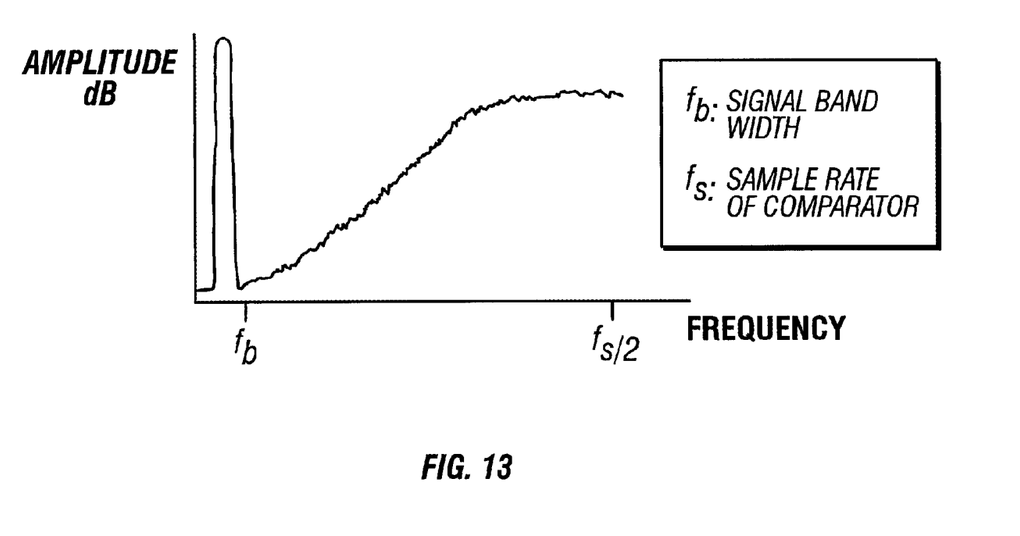
FIG. 13 is a graph showing an amplitude spectrum containing signal and noise in the output of the delta-sigma modulator.

The Δ-Σ modulator is oversampled, meaning that the data rate is much greater than the minimum required to sample accurately the input signal $A_{in}$ (greater than the Nyquist rate). The data at D, viewed in the frequency domain can be described over a range from 0 to $F_s/2$ (FIG. 13). The signal band is at the lower frequency end. In the signal band, a low amount of quantization noise is required. The rest of the spectrum of the Δ-Σ modulator output contain large amounts of quantization noise, which will be removed by a digital filter. The digital filter will often reduce the sample rate to the much lower Nyquist rate.

In a low noise Δ-Σ ADC (with a large oversampling ratio), the in-band quantization noise will usually be insignificant when compared to the thermal noise produced by the analog circuits. Further, the noise is dominated by the front end (1000, 1010, 1020, 1095) thermal noise. The coefficients a1, a2, a3 and a4 produce the quantization noise shaping and are selected, as discussed more hereinafter, to contribute to reduced power consumption in a unique way. A resonator b (1070) may be used to help reduce the quantization noise in the signal-band. Using the design described above, less than 12 mW of power is consumed in integrator 1 (1020).

Figure 11:
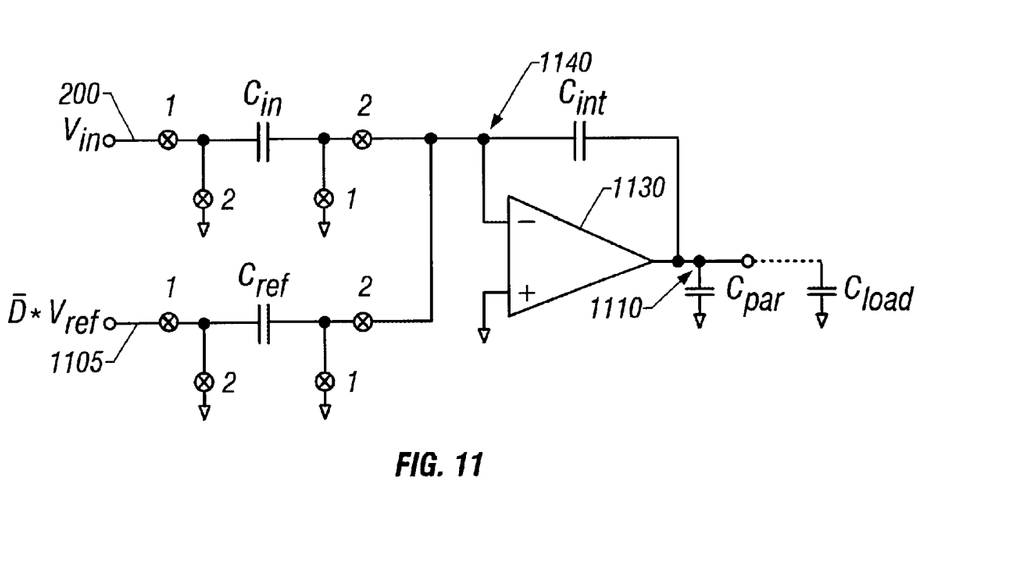
FIG. 11 is a schematic diagram of the front end (integrator 1 and its switched capacitor inputs) of the delta-sigma modulator of FIG. 10.

FIG. 11 is a simplified schematic diagram of the front end (integrator 1 and the switched capacitor input branches) of the delta-sigma modulator of FIG. 10, FIG. 11 is very similar to FIG. 2, differing in the existence of a second input. Input line 1105 corresponds to the subtraction input to subtraction circuit 1010 of FIG. 10. It receives, as feedback, the complement from the comparator 1080 having a logic value $\overline{D}$. The analog input comes from line 1000 of FIG. 10. The switched capacitor operation is substantially that described above in conjunction with FIG. 2. However, from the feedback input 1105, the polarity of the charge is controlled by the logic value of the feedback signal $\overline{D}$. By using the complement, we implement subtraction. Thus the inputs to the integrator function as the subtraction circuit 1010 shown in FIG. 10 as well as serving as an input to the integrator.

Returning to FIG. 10, each of the feedback coefficients a1, a2, a3 and a4 are selected to optimize low power consumption in the Δ-Σ modulator. The Δ-Σ modulator is deliberately operated at a higher sampling rate than would ordinarily be used so that the coefficients can be optimized for power minimization. Although the discussion of the coefficients which follows applies to any higher order modulator, the fourth order modulator shown in FIG. 10 will be utilized as an example.

Figure 12:
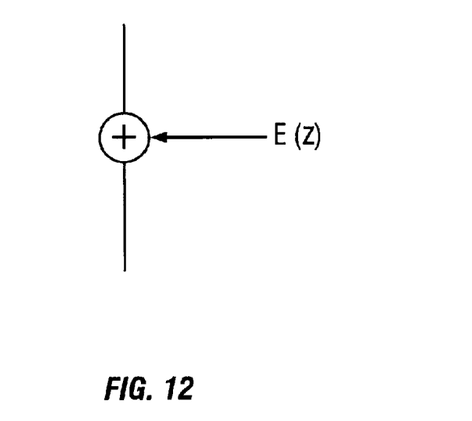
FIG. 12 is a schematic diagram representing an equivalent model of the comparator of the Δ-Σ modulator of FIG. 3.

FIG. 12 is a schematic diagram representing an equivalent model of the comparator of the Δ-Σ modulator shown in FIG. 11. The input E(z) is the white noise useful in modeling the 1-bit quantization noise resulting from a busy digital input signal. White noise has an even energy distribution across frequency.

Being 1-bit, E(z) is large. However, over sampling (running at a much greater frequency than the minimum sampling frequency, i.e. the Nyquist frequency) spreads this noise over a larger frequency range. Also, feedback loop has the effect of reducing the quantization noise at the low frequency end where the signal is found. Noise increases to a maximum at half the sample rate. This high frequency noise can be removed by a digital filter.

FIG. 13 is a graph showing a typical spectrum containing signal and noise in the output of a Δ-Σ modulator. FIG. 13 shows that the quantization noise in the band (up to fb) is low but not zero.

The strength of value of the coefficient a1, a2, a3 and a4 (FIG. 3) determine noise shaping. The set of coefficients was determined to give a Butterworth shape to the quantization noise model; that is, to the white noise spectrum. This can be done several ways, however, one way was disclosed in the masters thesis of co-inventor Wei Lee from Massachusetts Institute of Technology in 1987. Though the Butterworth equation was used to determine the noise shaping, other methods are also applicable to the technique to reduce power described. Common methods include other filter types (Elliptical, Chebyshev, etc.) as well as random generation and evaluation of coefficients. A method to reduce the power through coefficient selection at an increased sample rate will be described for the Butterworth filter analysis.

A higher cut-off frequency results in stronger attenuation of the in-band low frequency noise. However, this compromises the stability of the modulator resulting in lower maximum input.

Figure 14:
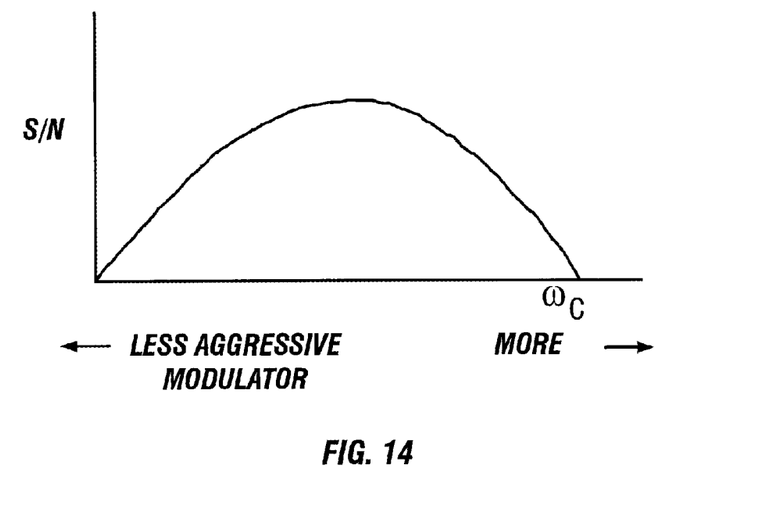
FIG. 14 is a graph of maximum signal/noise ratio in a delta-sigma modulator as a function of noise shaping cut off frequency.

FIG. 14 is a graph of a signal/noise ratio as a function of Butterworth filter cut off frequency $\omega_c$. At the low end of the curve shown in FIG. 14, there is not enough noise pushed out of the signal band and the signal/noise ratio is bad. At the high end of the curve, the noise is greatly reduced; however, stability of the modulator is reduced and only a small signal can be used, resulting in a poor signal to noise ratio. There is, thus, a maximum on the curve shown in FIG. 14 which is optimum from a signal to noise ratio perspective. This is where traditional design principles would suggest operating.

Contrary to the traditional approach, to conserve power in accordance with the invention, the modulator is run in the portion of the curve of FIG. 14 in which the stability is greatest, namely to the left side of the maximum S/N shown in the graph. This permits one to have the largest signal component compared to the feedback strength. The savings in power comes from two places. First, the larger signal overcomes the thermal noise of the front end. Secondly, the thermal noise of the feedback switched capacitor (or equivalent resistor) network is less relevant. In accordance with the invention, the 4th order modulator is run at higher than the oversampled rate required for a given S/N, so that a set of coefficients could be selected to the left of the maximum shown in FIG. 14. This technique is applicable to the other methods mentioned, including the random generation and evaluation of coefficients. In all cases, a curve similar to FIG. 14 could be produced.

Figure 15:
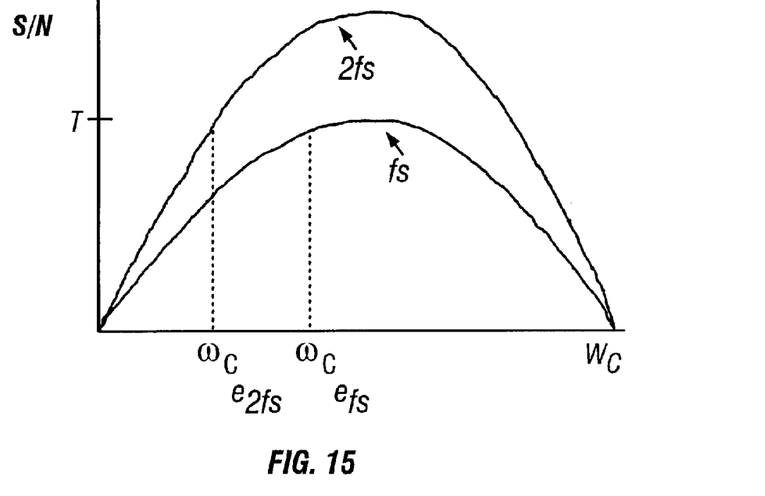
FIG. 15 is a graph relating signal to noise ratio at different oversampling rates.

FIG. 15 is a graph used in describing power savings achieved for a given signal to noise ratio as a result of selecting sampling rates in a unique manner. FIG. 15 compares the fourth order modulator of FIG. 10 run at two sample rates and compares the operating points that could have been used. As shown in FIG. 14, assuming that T is the minimum required signal to noise ratio, at a sampling rate $F_s$, the coefficient would have to be chosen near the optimum for signal to noise ratio, which is not good from a power consumption point of view. By running at a higher sample rate, in accordance with the invention, one can easily meet the signal to noise specification while simultaneously choosing coefficients near the optimum for power savings.

The modulator noise shaping equation used for the previous plots came from:

$$Y(z)\left[\frac{a_1}{Z-1} + \frac{a_2}{(Z-1)^2} + \frac{a_3}{(Z-1)^3} + \frac{a_4}{(Z-1)^4}\right] + E(z) = Y(z)$$

$$Y(Z)\left[1 + \frac{a_1}{Z-1} + \frac{a_2}{(Z-1)^2} + \frac{a_3}{(Z-1)^3} + \frac{a_4}{(Z-1)^4}\right] = E(Z)$$

This becomes:

$$\frac{Y(Z)}{E(Z)} = \frac{1}{1 + \frac{a_1}{Z-1} + \frac{a_2}{(Z-1)^2} + \frac{a_3}{(Z-1)^3} + \frac{a_4}{(Z-1)^4}}$$

$$\frac{1 - 4Z^{-1} + 6Z^{-2} - 4Z^{-3} + Z^{-4}}{1 + (a_1 - 4)Z^{-1} + (6 - 3a_1 - 4_2)Z^{-2} + (3a_1 - 2a_2 + a_3 - 4)Z^{-3} + (1 - a_1 + a_2 - a_3 + a_4)Z^{-4}}$$

$Y(z)/E(z) = H_e(z)$ represents the quantization noise at the output and describes the noise shape function. The form of the denominator is in the same form as a Butterworth filter. A program called Matlab was used to generate Butterworth filters of different cutoffs ($\omega_c$). The coefficients of these filters (terms multiplying $z^{-1}$, $z^{-2}$, $z^{-3}$ and $z^{-4}$) were used to find the modulator coefficients, a1, a2, a3 and a4. For each set, the signal to noise ratio and the maximum input for stable operation was found, to select the modulator used.

The combination of techniques described herein can save a significant amount of power. The cross coupled input structure boosting the effective signal is estimated to result in a 30% power savings over that which would occur without the input structure. The use of power management is estimated to result in approximately a 35% savings in power over that which would be available if the power management were not implemented. Increasing the maximum integrator step size is estimated to achieve a 25% power savings over that which would occur if the size were not increased. Finally, selection of the modulator coefficients as discussed is estimated to result in a 20% power savings over that which would have been achieved if the selection were not done in a manner described.

In this manner, one can achieve significant power savings. This has great practical application in a variety of fields, but particular in the field of seismic sensing.

Although the present invention has been described and illustrated in detail, it is clearly understood that the same is by way of illustration and example only and is not to be taken by way of limitation. For example, a variable power source can be implemented as a current source or as a voltage source. The spirit and scope of the present invention being limited only by the terms of the appended claims and their equivalents.

What is claimed is:

1. Electrical apparatus for capturing seismic signals from one or more seismic sensors, comprising:
    a. a voltage doubling input circuit receiving said seismic signals and providing an intermediate signal as an output; and
    b. an analog to digital converter having different power levels available during respective operational phases, said analog to digital converter receiving said intermediate signal and providing a digital output signal.

2. Electrical apparatus of claim 1 in which said analog to digital converter comprises:
    a. an analog input;
    b. a combination circuit connected to said analog input;
    c. an integrator receiving the output of the combination circuit, having a plurality of stages;
    d. a summing circuit receiving weighted outputs from at least two of said stages and producing a summed output; and
    e. a comparator receiving said summed output and, when said summed output exceeds a certain threshold value, providing a digital output signal to a digital output and to said combination circuit.

3. Electrical apparatus of claim 2 in which said integrator comprises a plurality of series connected stages with at least one stage having said combination circuit as an input circuit and said combination circuit comprises:
    a. a switched capacitor input circuit and a feedback input;
    b. an amplifier circuit connected to said switched capacitor input circuit and to said feedback input; and in which outputs of each stage are combined in a weighted fashion to provide a noise shaping signal at said feedback input.

4. The electrical apparatus of claim 3 in which said amplifier circuit comprises a power control circuit configured to provide high power to an active element during one portion of an operational cycle and to provide low power otherwise.

5. The electrical apparatus of claim 6 in which said power control circuit comprises two current mirrors in parallel.

6. The electrical apparatus of claim 5 in which one of said current mirrors is selectively activated only during said portion of an operational cycle.

7. The electrical apparatus of claim 6 in which said portion of an operational cycle comprises at least part of a slewing phase.

8. The electrical apparatus of claim 5 in which one of said current mirrors is larger in capacity than the other.

9. Electrical apparatus of claim 3 in which at least one stage of said integrator comprises an amplifier circuit having a capacitor connected between an output and one input of said amplifier circuit.

10. The electrical apparatus of claim 9 in which said switched capacitor input circuit and said feedback input are connected to said capacitor and said one input.

11. The electrical apparatus of claim 3 in which said amplifier circuit comprises:
    a. an input receiving a digital signal;
    b. an active element receiving said signal from said input; and
    c. a power control circuit having two output levels connected to said active element and selectively providing one of said levels to said element only during a portion of its operating time.

12. The electrical apparatus of claim 3 in which said amplifier circuit comprises an amplifier circuit having two current sources and an active element, connected to said current sources so that only one current source is active during an operation phase when power requirements are relatively low and so that both current sources are active during an operational phase when power requirements are relatively high.

13. The electrical apparatus of claim 3 in which said amplifier circuit includes a control circuit comprising:
    a. a first current source connected in series with a first active device and a second active device, with each active device having a gate terminal;
    b. a second constant current source connected in series with a third active device and a fourth active device, each active device having a gate terminal, with the gates of said third active device and said second active device connected together; and
    c. an output device having a gate terminal connected to the junction of said second current source and said third active device and controlled thereby.

14. The electrical apparatus of claim 2 in which the step size of the digital output applied to said subtraction circuit is optimized to conserve power.

15. The electrical apparatus of claim 2 operated at a sampling rate substantially in excess of the Nyquist rate.

16. Electrical apparatus for capturing seismic signals from one or more seismic sensors, having an analog to digital converter, said analog to digital converter comprising:

a. an analog signal input; and b. a delta modulator converter having different power levels available during respective operational phases receiving said analog signal input, said delta modulator sampling said analog signal input at a rate substantially in excess of the Nyquist rate, in which said delta modulator comprises a multistage integrator, in which weighted values of outputs of stages of a multistage integrator in said delta modulator are combined to form a feedback signal, and in which said feedback signal is combined with a signal from said analog signal input.

17. Electrical apparatus of claim 16 in which power is provided to at least one component of said delta modulator in a high power mode during slewing and in a low power mode at other times.

18. A seismic system, comprising:

a. a plurality of seismic sensors;

b. a signal capture point connected to said plurality of seismic sensors;

c. said signal capture point containing at least one signal capture front end for interfacing connections to one or more of said seismic sensors; said signal capture front end comprising:

c1. an analog signal input; and c2. a delta modulator converter having different power levels available during respective operational phases receiving said analog signal input, said delta modulator comprising a multistage integrator, in which weighted values of outputs of stages of a multistage integrator in said delta modulator are combined to form a feedback signal, and in which said feedback signal is combined with a signal from said analog signal input.

19. The seismic system of claim 18 in which power is provided to at least one component of said delta modulator in a high power mode during slewing and in a low power mode at other times.

20. A method for saving power in a seismic system, comprising the step of:

running a delta sigma modulator used for processing seismic signals at a greater oversampling rate than required by signal to quantization noise requirements.

21. A method for saving power in a seismic system, comprising the step of:

optimizing feedback coefficients from an integrating circuit of a delta sigma modulator, receiving seismic signals, for reduced power consumption.

22. A method for saving power in a seismic system, comprising the step of:

maximizing the step size of the delta sigma modulator receiving seismic signals for power consumption savings.

23. An integrated circuit, comprising a seismic system having one or more of:

a. a circuit for increasing current available to the seismic system irrespective of actual signal level applied to the seismic system during an operational phase when slew is expected;

b. a circuit for decreasing current available to the seismic system during an operational phase when little activity is expected;

c. a clock applied to a delta sigma modulator and used for processing seismic signals at a greater oversampling rate than required by signal to quantization noise requirements; and an integrating circuit of a delta sigma modulator having feedback coefficients optimized for reduced power consumption.

* * * * *